(12) United States Patent
Tribedi (10) Patent No.: US 9,679,088 B1
(45) Date of Patent: Jun. 13, 2017

(54) TECHNIQUE FOR USING VARIABLE SOIL BEARING CAPACITY IN FOUNDATION DESIGN

(71) Applicant: Bentley Systems, Incorporated, Exton, PA (US)

(72) Inventor: Apurba Tribedi, Yorba Linda, CA (US)

(73) Assignee: Bentley Systems, Incorporated, Exton, PA (US)

( * ) Notice: Subject to any disclaimer, the term of this patent is extended or adjusted under 35 U.S.C. 154(b) by 801 days.

(21) Appl. No.: 13/768,969

(22) Filed: Feb. 15, 2013

(51) Int. Cl.
*G06F 17/50* (2006.01)
(52) U.S. Cl.
CPC .................. *G06F 17/5004* (2013.01)
(58) Field of Classification Search
CPC .. G06F 17/50; G06F 17/5004; G06F 17/5018; G06F 17/5095; G06T 19/00
USPC ............................................................ 703/1
See application file for complete search history.

(56) References Cited

U.S. PATENT DOCUMENTS 5,526,609 A * 6/1996 Lee .................... E01D 19/00
                                                        52/1

OTHER PUBLICATIONS

Digioia, Jr., PhD, PE, Anthony M., "Fundamental Principles of Foundation Design," DiGioia, Gray and Associates, LLC, IEEE TP&C Subcommittee Meeting, Orlando, Florida, Jan. 8-11, 2007, pp. 1-49.
"Rapid Interactive Structural Analysis-Foundation Analysis and Design: User's Guide," RISAFoundation, RISA Technologies, LLC, Jan. 15, 2013, pp. 1-170.
"STAAD Foundation Advanced: User Manual, V8i," Bentley Systems, Incorporated, Nov. 3, 2011, pp. 1-456.

* cited by examiner

*Primary Examiner* — Saif Alhija
(74) *Attorney, Agent, or Firm* — Cesari and McKenna, LLP; James A. Blanchette (57) ABSTRACT

In one embodiment, a computer-aided foundation design technique employs variable soil parameters that are dynamically updated based on changes in footing shape, size, and/or embedment depth. The variable soil parameters may include a variable soil bearing capacity. The variable soil bearing capacity may be represented as a series of bearing capacity interaction curves that indicate an allowable bearing capacity for different footing dimensions and embedment depths. As part of the computer-aided foundation design technique, different combinations of footing dimensions and/or embedment depths may be iterated through, and for each iteration, base pressures may be tested against a soil bearing capacity that is specific to that combination of footing dimension and embedment depth.

23 Claims, 8 Drawing Sheets

| Dr (m) | FOOTING DIMENSION B (m) FOR SQUARE FOOTING |||||||||||
|---|---|---|---|---|---|---|---|---|---|---|---|
| | 0.5 | 1.0 | 1.5 | 2.0 | 2.5 | 3.0 | 3.5 | 4.0 | 4.5 | 5.0 |
| 0.5 | 97  | 105 | 107 | 110 | 106 | 101 | 92  | 82  | 76  | 5.0 |
| 1.0 | 105 | 113 | 115 | 117 | 114 | 111 | 102 | 92  | 88  | 7.1 |
| 1.5 | 113 | 121 | 123 | 125 | 122 | 119 | 111 | 101 | 97  | 84  |
| 2.0 | 122 | 129 | 131 | 133 | 124 | 121 | 119 | 110 | 105 | 93  |
| 2.5 | 130 | 136 | 140 | 142 | 132 | 128 | 123 | 113 | 108 | 100 |
| 3.0 | 140 | 144 | 148 | 151 | 138 | 135 | 130 | 118 | 113 | 103 |
|     |     |     |     |     |     |     |     |     |     | 108 |

TECHNIQUE FOR USING VARIABLE SOIL BEARING CAPACITY IN FOUNDATION DESIGN

BACKGROUND

Technical Field

The present disclosure relates generally to computer-aided engineering design, and more specifically to computer-aided foundation design.

Background Information

Typically, foundation design is performed as a discrete process, with a geotechnical engineer providing a few initial soil parameters in an initial soil report, which are then used by a structural engineer to design the foundation. The initial soil parameters in the initial soil report provided by the geotechnical engineer are generally not updated (i.e. remain fixed) as the foundation design evolves. For example, the initial soil report may include a soil bearing capacity that is used in the design a footing of the foundation. However, this soil bearing capacity is generally not updated (i.e. remains fixed) as the foundation design evolves, for instance as the footing size, shape and embedment depth are refined by the structural engineer. Knowing that initial soil parameters in the initial soil report, such as soil bearing capacity, are typically treated as fixed values throughout the design process, geotechnical engineers often provide overly conservative values. The use of these overly conservative values often results in structural engineers specifying overly large footings, which incur excessive material costs. Further, despite providing overly conservative values, in some cases, the final footing configuration specified by a structural engineer who has relied on the initial soil parameters in the initial soil report may still be unsafe. While the values may be overly conservative within a certain range, if the foundation design evolved considerably, they could be inappropriate for the final footing configuration specified, leading to a false sense of security.

Accordingly, there is a need for an improved technique that may address these and other shortcomings of prior foundation design techniques.

SUMMARY

In one embodiment, a computer-aided foundation design technique employs variable soil parameters that are dynamically updated, for example, based on changes in footing shape, size, and/or embedment depth. The variable soil parameters may include a variable soil bearing capacity. The variable soil bearing capacity may be represented as a series of bearing capacity interaction curves that indicate an allowable bearing capacity for different footing dimensions and embedment depths. As part of the computer-aided foundation design technique, different combinations of footing dimensions and/or embedment depths are iterated through, and for each iteration, base pressures are tested against a soil bearing capacity that is specific to that combination of footing dimension and embedment depth. Rather than use a fixed soil bearing capacity provided as part of initial soil parameters, the computer-aided foundation design technique obtains a new soil bearing capacity for each iteration, such that the soil bearing capacity may vary from iteration to iteration.

As a result of using variable soil parameters, for example variable soil bearing capacity, the computer-aided foundation design technique may produce foundation designs that are often of smaller size, yet have a greater assurance of safety, than designs produced by techniques that employ traditional fixed initial soil parameters, for example, fixed soil bearing capacity.

BRIEF DESCRIPTION OF THE DRAWINGS

The description below refers to the accompanying drawings of example embodiments, of which.

DETAILED DESCRIPTION

The issues presented in typical foundation design may be illustrated by reference to specific examples. Much of the discussion below refers to an example of a structural engineer tasked with designing a foundation that includes a rectangular (either square or strip) isolated footing. While such example may help illustrate the computer-aided foundation design technique described herein, it should be understood that the technique is applicable to a wide variety of foundation designs that include other types of foundations structures, for instance, wall footings, combined footings, cantilever or strap footings, or other types of structures.

Figure 1A:
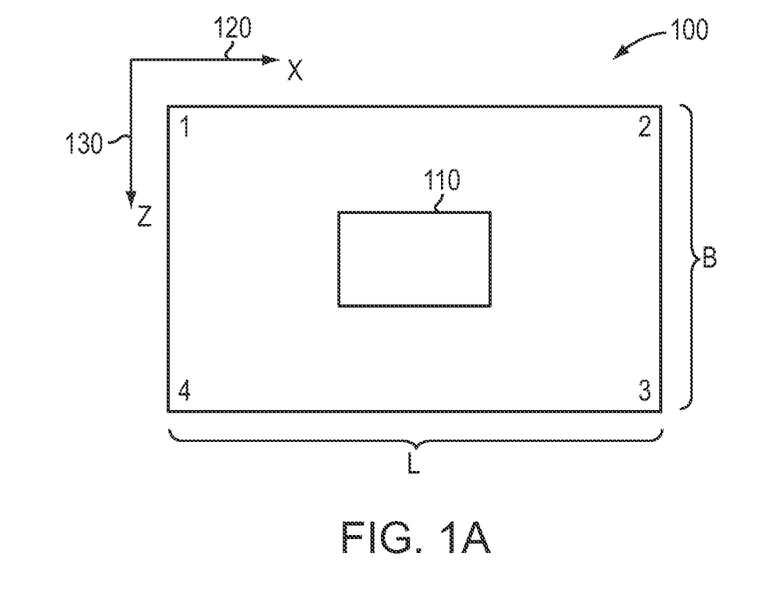
FIG. 1A is a top-down view of an example rectangular isolated footing designed to support a column that may assist in illustrating the computer-aided foundation design technique.

FIG. 1A is a top-down view of an example isolated footing 100 designed to support a single column 110. The example isolated footing 100 is defined by a footing length (L) and footing width (B), referred to collectively (along with potentially a footing height) as "footing dimensions". The example footing has four corners, which are referenced by subscripts 1, 2, 3, 4 in later discussions. A coordinate system, for example a Cartesian coordinate system including an x-axis 120 and a z-axis 130, may be imposed on the footing 100.

Figure 1B:
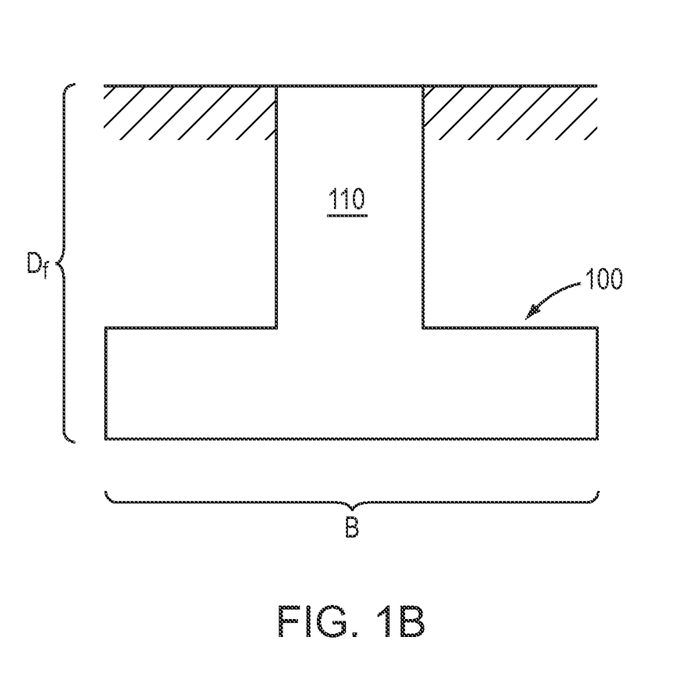
FIG. 1B is a side view of the example rectangular isolated footing of FIG. 1A.

FIG. 1B is a side view of the example isolated footing 100 of FIG. 1A. As shown, the footing 100 has an embedment depth ($D_f$) representing a distance from ground level 130 to the bottom of the footing.

As part of the service design of a foundation that incorporates the footing 100, a structural engineer may be tasked with determining the exact shape, size, embedment depth, as well as other parameters, of the footing. To do so, the structural engineer may perform several checks, including a base pressure check, a stability check, and strength design checks. The base pressure check is used to determine whether an assumed footing shape and size, defined by footing dimensions (L×B), will produce pressures that can be adequately supported by the bearing capacity of the soil under the footing.

Figure 2:
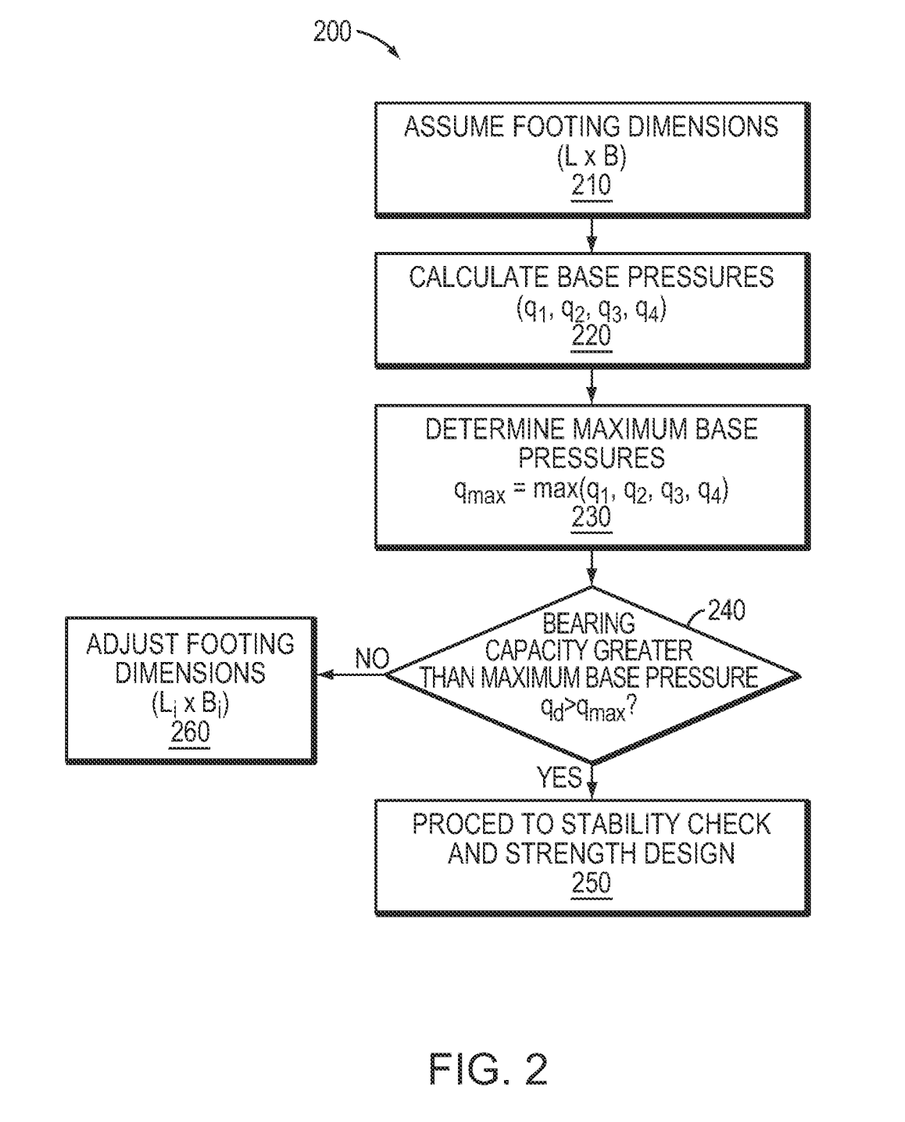
FIG. 2 is a flow diagram of an example procedure often used to determine footing dimensions that satisfy a typical base pressure check.

FIG. 2 is a flow diagram 200 of an example procedure often used to determine footing dimensions that satisfy a typical base pressure check. At step 210, the structural engineer assumes certain dimensions (L×B) for the footing. These assumed dimensions may represent a "best guess" based on the structural engineer's experience, or may be more rigorously determined. At step 220, the structural engineer calculates base pressures for the footing. Since the base pressure may differ at each of the corners of the footing, due to biaxial bending, the bases pressures determined in step 220 are typically corner base pressures ($q_1$, $q_2$, $q_3$, $q_4$). In many cases, where the footing is subject to axial load and biaxial bending, but is not in uplift, each corner base pressure may be calculated using the formula:

$$q = \frac{P}{A} \pm \frac{M_x}{S_x} \pm \frac{M_z}{S_z}$$

where q is corner base pressure, $M_x$ and $M_z$ are signed moment about an x-axis and a z-axis, respectively, P is axial compression, A is footing area, and $S_x$ and $S_z$ are section modulus. At step 230, the structural engineer determines a maximum of the corner base pressures. At step 240, the structural engineer compares the maximum corner base pressure with a soil bearing capacity ($q_d$), typically provided to the structural engineer as part of initial soil parameters supplied by a geotechnical engineer. Since the soil bearing capacity is generally not updated during the structural engineer's calculations, it may be referred to as a "fixed soil bearing capacity". If the fixed soil bearing capacity is greater than the maximum corner base pressure, the structural engineer assumes the soil will bear the pressure, and the structural engineer proceeds to step 250, where he or she performs stability checks and considers strength designs for the footing, for example, performs shear and moment checks. Otherwise, the structural engineer proceeds to step 260, where he or she adjusts the footing dimensions (L×B), for instance increasing the dimensions so that pressure is further distributed upon the soil, and then proceeds back to step 220. The steps 220-240 are repeated so that new corner base pressures are calculated, their maximum determined, and compared to the fixed soil bearing capacity. This sequence may be repeated again, and again, until the fixed soil bearing capacity is greater than the maximum corner base pressure, and it is ok to proceed to step 260. However, it should be remembered that, through each iteration of the sequence, the soil bearing capacity is generally not updated.

The use of a fixed soil bearing capacity may result in the structural engineer specifying an overly large footing. Further, even if the fixed soil bearing capacity was chosen to be very conservative by a geotechnical engineer, should the foundation design evolve such that the footing changes in shape, size and/or embedment depth considerably, it may be still lead to an unsafe condition depending on the geotechnical engineer's assumptions regarding structural loads and dimensions.

The bearing capacity of soil varies due to conditions. First, soil bearing capacity changes based on the shape and size of a footing. Typically, soil bearing capacity increases with increases in footing width. Further, for a given width, a square footing typically has a higher soil bearing capacity than a strip footing (i.e. a rectangular-shaped footing whose length is substantially greater than its width). For example, under certain site conditions, a square footing having a footing length of 1 meter (m) and footing width of 1 m, may have a soil bearing capacity of 113 kilopascal (kPa). However, under the same site conditions, a square footing having a footing length of 6 m and footing width of 6 m, may have a soil bearing capacity of 135 kPa. Likewise, under some site conditions, a strip footing having a footing length of 1 m and footing width of 10 m, may have a soil bearing capacity of 89 kPa. However, under the same site conditions, a strip footing having a footing length of 6 m and a footing width of 60 m, may have a soil bearing capacity of 108 kPa. It should be understood that these figures are merely examples intended to show an approximate trend, and that depending on the site conditions or other factors, exact soil bearing capacities will be different.

Second, soil bearing capacity changes based on footing embedment depth. Typically, soil bearing capacity increases with increases in embedment depth. For example, under certain site conditions, for a square footing having a footing length of 1 m and a footing width of 1 m, the soil may have a bearing capacity of 107 kPa at an embedment depth of 1.0 m, a bearing capacity of 113 kPa at an embedment depth of 1.5 m, and a bearing capacity of 125 kPa at an embedment depth of 2.0 m. Similarly, for a strip footing having a footing length of 5 m and a footing width of 10 m, the soil may have a bearing capacity of 125 kPa at an embedment depth of 1.0 m, a bearing capacity of 136 kPa at an embedment depth of 1.5 m, and a bearing capacity of 160 kPa at an embedment depth of 2.0 m. Again, it should be understood that these figures are merely examples to show an approximate trend, and that depending on the site conditions or other factors the exact soil bearing capacities will be different.

The above discussed changes in soil bearing capacity produced as a result of changes in footing size, shape and embedment depth may be empirically understood by looking to components of soil bearing capacity. Soil bearing capacity is generally a combination of two failure criteria: shear failure and soil settlement. One empirical formula used to calculate soil bearing capacity resulting from shear failure is:

$$q_d = cN_c + qN_q + \frac{1}{2}\gamma BN_\gamma$$

where c is cohesion, q is soil surcharge, γ is soil density, B is width of the footing, $N_c$, $N_q$ and $N_\gamma$ are bearing capacity factors, and $q_d$ is soil bearing capacity. As can be seen, the third term in the right-hand portion of the equation is based on the dimensions of the footing, specifically the footing width (B). Further, the second term in the right-hand portion of the equation is calculated as $q=\gamma D_f$, where $D_f$ is the embedment depth of the footing. As such, at least where shear failure controls bearing capacity, the bearing capacity clearly depends on dimensions of the footing and footing embedment depth.

Changes in bearing capacity due to this dependency may cause problems as a foundation design evolves, yet a fixed bearing capacity is still being used. For example, if the bearing capacity value specified in initial soil parameters was originally determined by a geotechnical engineer who envisioned a smaller footing width than the width eventually specified by the structural engineer, the bearing capacity value may be understated, leading the structural engineer to specify an overly large footing (and thereby an overly large foundation). This may incur unneeded material costs. Conversely, if the geotechnical engineer envisioned a larger footing width than the actual width eventually specified by the structural engineer, the bearing capacity value specified in the initial soil parameters may be overstated, leading the structural engineer to unknowingly specify a footing that could be unsafe.

To address these and other shortcomings, a computer-aided foundation design technique may be used that employs a variable soil bearing capacity that is dynamically updated based on, for example, changes in footing shape, size, and/or embedment depth. The variable soil bearing capacity may be represented as a series of bearing capacity interaction curves that indicate an allowable bearing capacity for different footing dimensions and embedment depths. As part of the computer-aided foundation design technique, different combinations of footing dimensions and/or embedment depths are iterated through, and for each iteration, base pressures may be tested against a soil bearing capacity particular to that combination of footing dimensions and embedment depth. Rather than use a fixed soil bearing capacity provided as part of initial soil parameters, the computer-aided foundation design technique obtains a new bearing capacity for each iteration, such that the bearing capacity may vary from iteration to iteration. Foundation designs may be produced that are of smaller size, yet have a greater assurance of safety, than designs produced by techniques that rely upon a traditional fixed soil bearing capacity.

Figure 3:
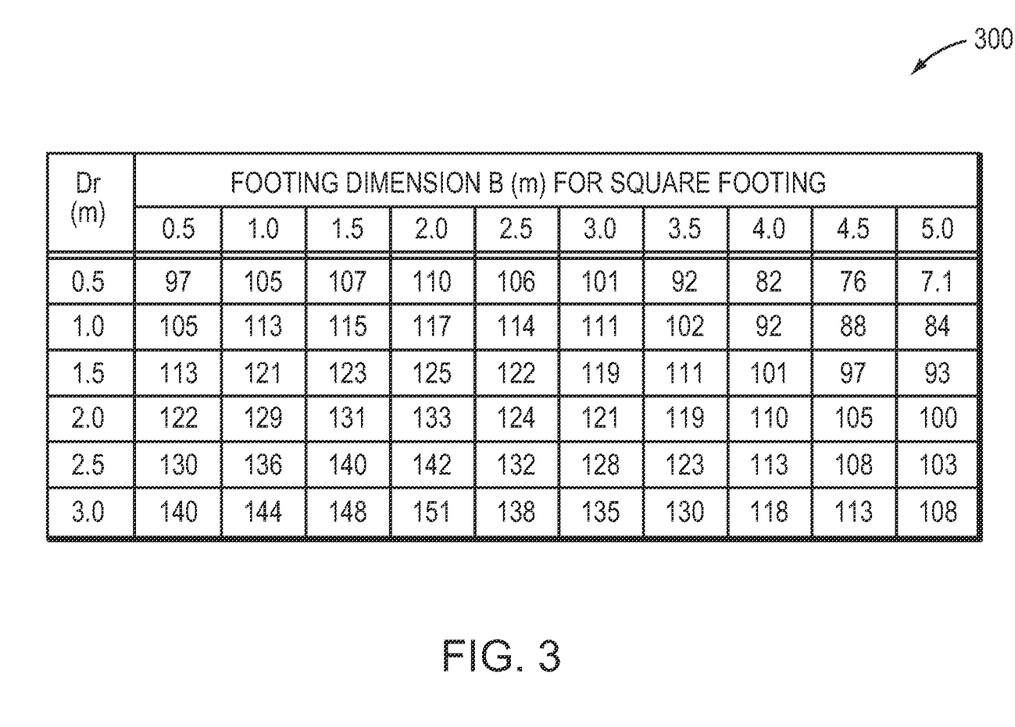
FIG. 3 is an example bearing capacity matrix from which bearing capacity interaction curves may be derived.

FIG. 3 is an example bearing capacity matrix 300 from which bearing capacity interaction curves may be derived. The example bearing capacity matrix 300 indicates a soil bearing capacity for different combinations of dimensions, here footing widths (B) represented in the columns, and embedment depth ($D_f$) represented in the rows. These soil bearing capacities may be applicable to a square footing under certain site conditions. It should be understood that a number of bearing capacity matrixes may be maintained that are each for different types and shapes of footings, under different site conditions. Accordingly, while only a single example bearing capacity matrix 300 is shown, a plurality of such matrixes may be employed.

Figure 4:
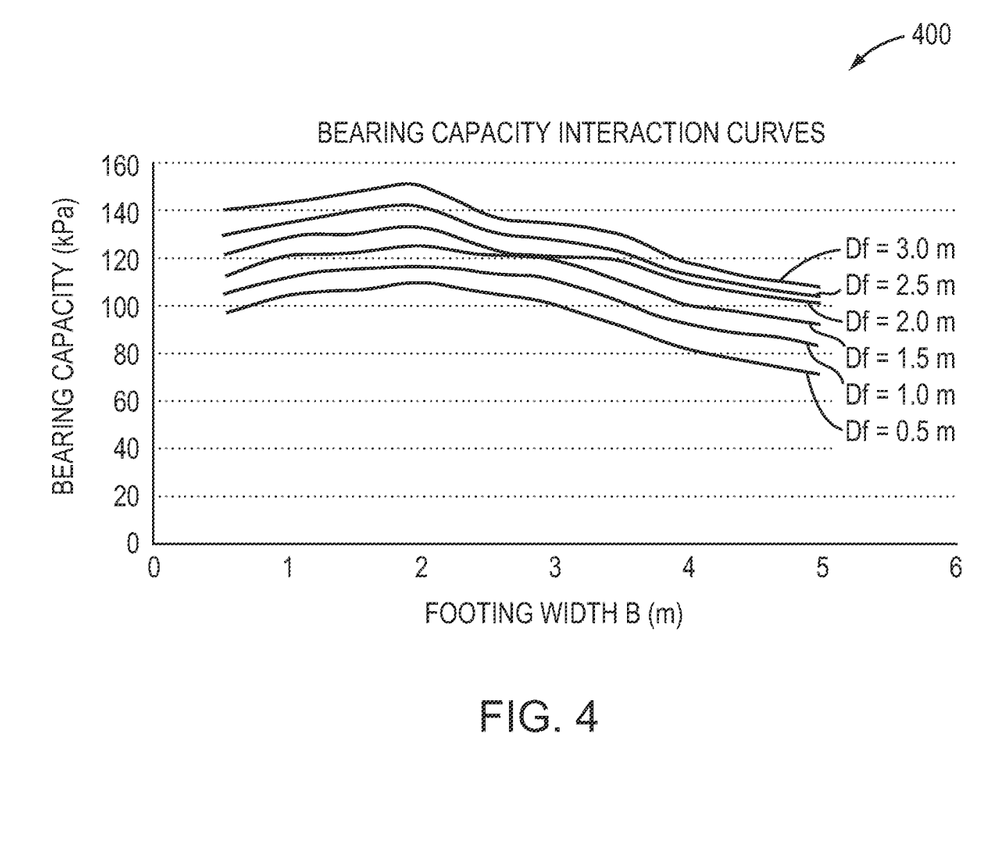
FIG. 4 is an illustration of an example series of bearing capacity interaction curves derived from the example bearing capacity matrix of FIG. 3.

FIG. 4 is an illustration of an example series of bearing capacity interaction curves 400 derived from the example bearing capacity matrix 300 of FIG. 3. Each example bearing capacity interaction curve indicates a soil bearing capacity for a certain embedment depth ($D_f$) for differing footing dimensions, here different footing widths (B). In contrast to FIG. 3, the bearing capacity interaction curves indicate soil bearing capacity for a continuum of values, rather than for only certain discreet values. Each bearing capacity interaction curve may be derived from a corresponding row of the bearing capacity matrix 300, by application of a curve fitting algorithm to the data contained therein, to produce a mathematical formula. While the bearing capacity curves are graphically illustrated in FIG. 4, it should be understood that such curves need not be graphically presented, and may simply exist in the form of a mathematical formula, which can be utilized to obtain a bearing capacity value for footing dimensions for a particular embedment depth. As footing dimensions and/or embedment depths are iterated through as part of a foundation design process, the mathematical formula may be accessed to obtain a bearing capacity that is particular to that combination of footing dimensions and embedment depth.

Figure 5:
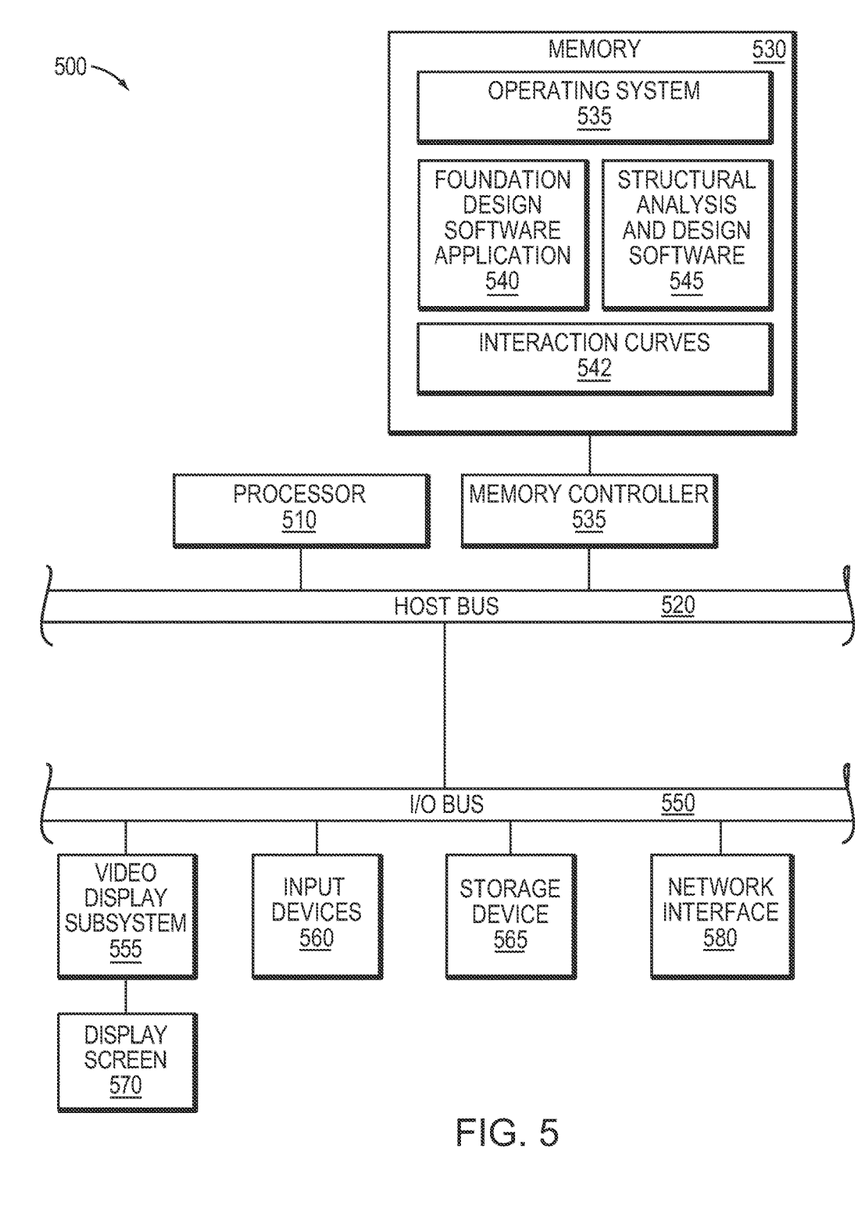
FIG. 5 is a block diagram of an example electronic device that may execute a foundation design software application implementing the computer-aided foundation design technique.

The computer-aided foundation design technique may be implemented by a foundation design software application executing on an electronic device. FIG. 5 is a block diagram of an example electronic device 500 that may be used. The electronic device 500 may be a designed for stationary operation (e.g., may be a desktop computer), or may be portable electronic device (e.g., a notebook computer, a tablet computer, a smartphone, etc.). The electronic device 500 includes at least one processor 510 coupled to a host bus 520. The processor 510 may be any of a variety of commercially available processors, such as an Intel x86 processor, or another type of processor. A volatile memory 530, such as a Random Access Memory (RAM), is coupled to the host bus 520 via a memory controller 525.

The memory 530 is configured to store at least a portion of computer-executable instructions and data for an operating system (OS) 535 while the electronic device 500 is operating. In addition, the memory 530 may be configured to store at least a portion of computer-executable instructions and data for a foundation design application 540. The foundation design application 540 may be capable of a variety of functions related to analysis and design of foundations, and may be capable of producing a variety of types of output, including reports, detailed three-dimensional (3D) renderings, construction documents, etc. The functions may implement base pressure checking, as well as stability checking for the site conditions, using an iterative approach as discussed below. The data for the foundation design application 340 may include a series of bearing capacity interaction curves 542 used as part of the base pressure checking. In one embodiment, the foundation design software application 540 is the STAAD Foundation Advanced software program available from Bentley Systems, Inc.

In some cases, the foundation design software application 540 may interact with structural analysis and design engineering software 545, portions of which may also be stored in the memory 530. The interaction may include automatic importing and updating of geometry, loads, and reactions, which are relevant to foundation design. In one embodiment, the structural analysis and design engineering software 545 is the STAAD.Pro software package available from Bentley Systems, Inc.

The host bus 520 of the electronic device 500 is coupled to an input/output (I/O) bus 550 through a bus controller 545. A video display subsystem 555 may include a display screen 570 and hardware to drive the display screen. The video display subsystem 555 is coupled to the I/O bus 550. The display screen 570, among other functions, may show a graphical user interface (GUI) of the foundation design application 540. One or more input devices 560, such as a keyboard, touch sensor, touchpad, mouse, etc., are provided and used by a user (e.g., a structural engineer) to interact with the electronic device 500, and the software, such as the foundation design application 540, executing on the electronic device. A persistent storage device 565, such as a hard disk drive, a solid-state drive, or other type or persistent data store, is coupled to the I/O bus 550, and may persistently store computer-executable instructions and data, that are available to be loaded into the volatile memory 530 when needed. For example, computer-executable instructions and data for the operating system 535, the foundation design application 540, and in some cases, the structural analysis and design engineering software 545, may be stored in the persistent storage device 565. The I/O bus 550 may further be coupled to a network interface 580 that interfaces with a computer network 590, such as the Internet. The computer network 590 may allow communication between the electronic device 500 and other devices, using any of a number of well known networking protocols. Such communication may enable a number of collaborative, distributed, and remote computing arrangements.

Figure 6:
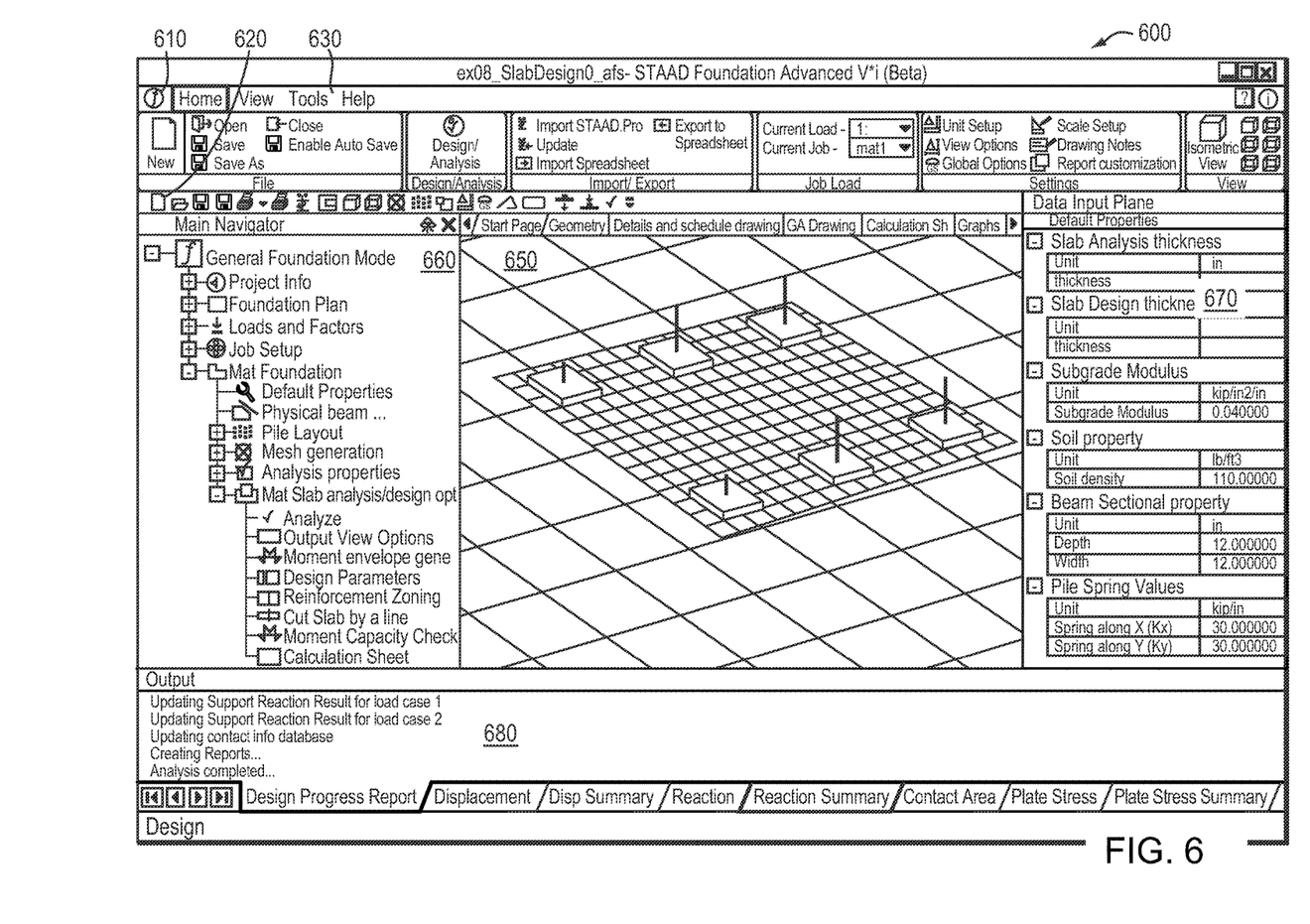
FIG. 6 is an example screen shoot of a graphical user interface (GUI) for the foundation design application.

FIG. 6 is an example screen shoot of a GUI 600 for the foundation design application 540. The GUI may include an application menu bar 610 through which file and application-level setting may be accessed, a quick access toolbar 620 through which frequently used functions may be accessed, a title bar 630 that displays a name of a foundation design project that is currently open and active, and a ribbon 640 with menus for interacting with the project. A main navigation pane 650 may include options for handing design flow and for displaying forms, tables, dialog boxes, etc. A tabbed view window 660 may provide a main view of the project, displaying graphics as well as numeric analysis output, when applicable. A data input pane 670 may include fields for receiving properties and options for the project. Further, an output pane 680 may indicate design progress and display certain output information.

Figure 7:
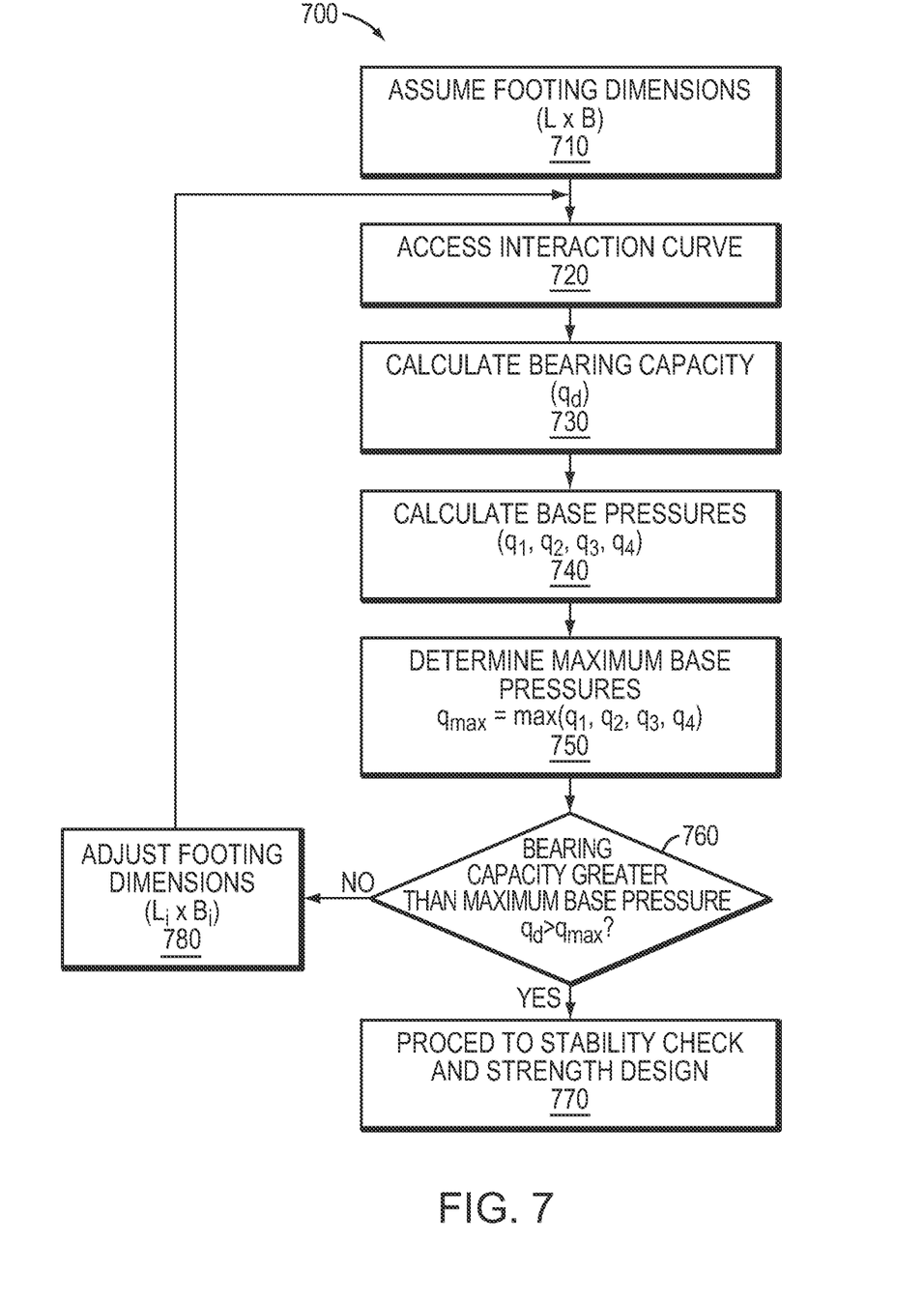
FIG. 7 is a flow diagram of an example sequence of steps that may be executed by the foundation design application to implement one embodiment of the computer-aided foundation design technique.

FIG. 7 is a flow diagram of an example sequence of steps 700 that may be executed by the foundation design application 540 to implement one embodiment of the computer-aided foundation design technique, specifically to determine footing dimensions that satisfy a base pressure check, where the embedment depth remains constant during stability check and strength design check operations. At step 710, the foundation design application 540 assumes certain dimensions (L×B) for the footing. These assume dimensions may be based on input entered by the user in the GUI 600 or automatically determined by the application 540. At step 720, the foundation design application 540 accesses a bearing capacity interaction curve 540 stored in the memory 530 that is appropriate for the shape of the footing and the embedment depth. This curve may be provided for the specific project being design, or may be part of a library of stored bearing capacity interaction curves applicable to a range of different projects. At step 730, the foundation design application 540 employs the bearing capacity interaction curve to calculate a soil bearing capacity ($q_d$) for the footing dimensions. For example, where the bearing capacity interaction curve takes the form of a mathematical formula, the formula may be evaluated to yield the soil bearing capacity ($q_d$). At step 740, the foundation design application 540 calculates base pressures for the footing. The base pressures may take the form of corner base pressures ($q_1$, $q_2$, $q_3$, $q_4$). At step 750, the foundation design application 540 determines a maximum of the corner base pressures. At step 760, the foundation design application 540 compares the maximum corner base pressure with the soil bearing capacity ($q_d$) for the footing dimensions. If the soil bearing capacity is greater than the maximum corner base pressure, execution proceeds to step 770, where the footing dimensions are used in further operations, for instance in stability checks and strength design checks (e.g., shear and moment checks) that are performed. Otherwise, execution proceeds to step 780, where the foundation design application 540 adjusts the dimensions (L×B) for the footing, for example, increments them to larger dimensions, and then execution proceeds back to step 720. The steps 720-760 are repeated so that new corner base pressures are calculated, their maximum determined, and the maximum compared to the soil bearing capacity obtained from the applicable bearing capacity interaction curve. This sequence may be repeated again, and again, until the soil bearing capacity obtained from the applicable bearing capacity interaction curve is greater than the maximum corner base pressure, and it is ok to proceed to step 770.

As part of the stability check and strength design of a footing, footing thickness is often optimized. When footing thickness is changed, one option (referred to the "bottom fixed option") maintains the same distance between the bottom of the footing and the soil surface, adjusting the top of the footing to yield a different footing thickness. In the bottom fixed option, embedment depth remains fixed. Accordingly, a procedure according to FIG. 7 may be used. Another option (referred to as the "top fixed option") maintains the same distance between the top of the footing and the soil surface, instead adjusting the bottom of the footing to yield a different footing thickness. In the top fixed option, embedment depth is changed as part of the stability check and strength design of the footing, and additional base pressure checking may be warranted.

Figure 8:
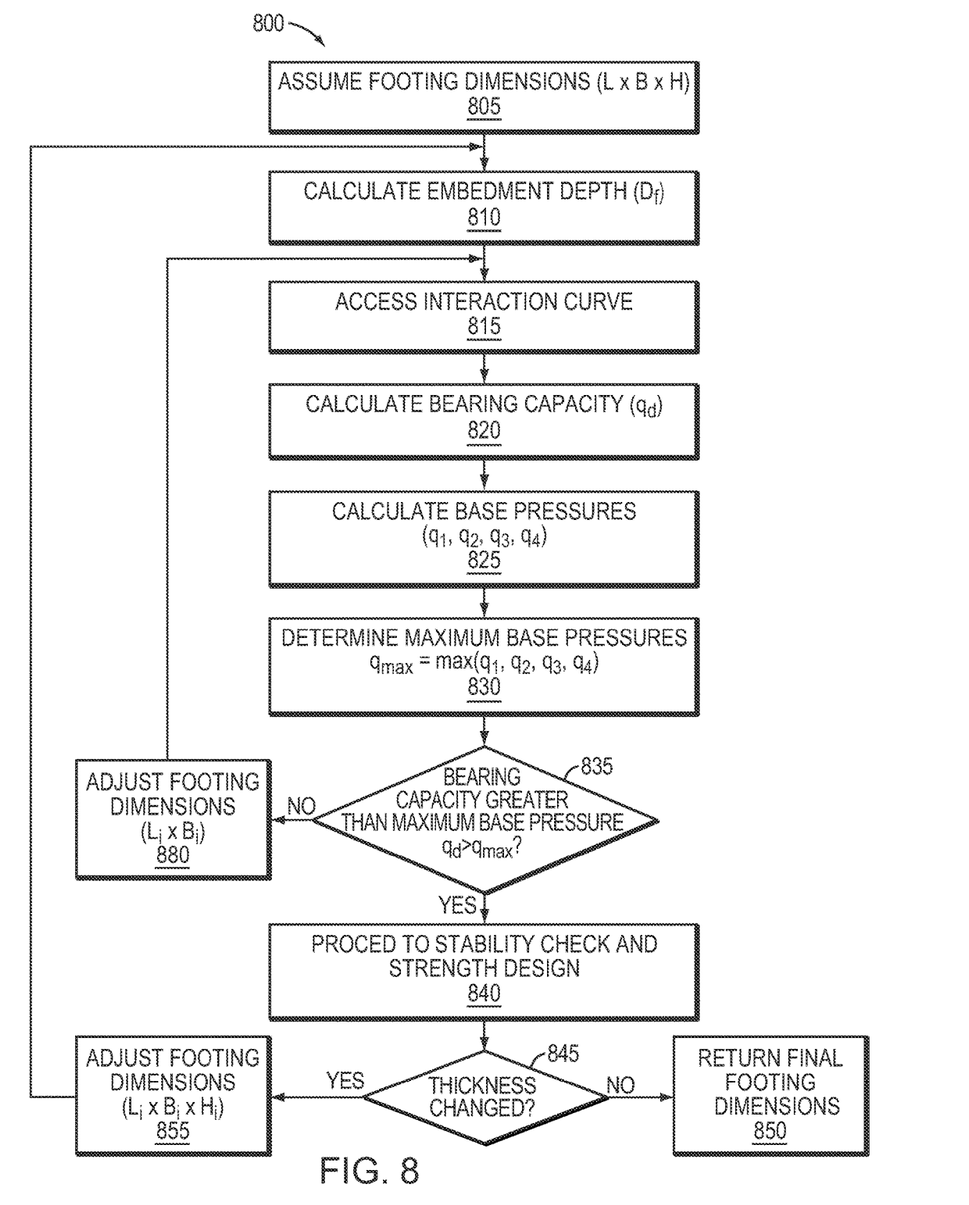
FIG. 8 is a flow diagram of an example sequence of steps that may be executed by the foundation design application to implement another embodiment of the computer-aided foundation design technique.

FIG. 8 is a flow diagram of an example sequence of steps that may be executed by the foundation design application 540 to implement another embodiment of the computer-aided foundation design technique, specifically to determine footing dimensions that satisfy a base pressure check, where the embedment depth is changed as part of stability check and strength design check operations. At step 805, the foundation design application 540 assumes certain dimensions (L×B×H) for the footing. At step 810, the foundation design application 540 calculates an embedment depth ($D_f$), for example, taking into account footing thickness (H) according to a top fixed option for footing design. At step 815, the foundation design application 540 accesses a bearing capacity interaction curve stored in the memory 530 that is appropriate for the shape of the footing and the calculated embedment depth. At step 820, the foundation design application 540 employs the bearing capacity interaction curve to calculate a soil bearing capacity ($q_d$) for the footing dimensions. At step 825, the foundation design application 540 calculates base pressures for the footing, e.g., corner base pressures ($q_1$, $q_2$, $q_3$, $q_4$). At step 830, the foundation design application 540 determines a maximum of the corner base pressures. At step 835, the foundation design application 540 compares the maximum corner base pressure with the soil bearing capacity ($q_d$) for the footing dimensions. If the soil bearing capacity is less than the maximum corner base pressure, execution proceeds to step 845, where the foundation design application 540 adjusts dimensions (L×B) for the footing, for example increments them to larger dimensions, and then proceeds back to step 815. The steps 815-835 are repeated so that new corner base pressures are calculated, their maximum determined, and the maximum compared to the soil bearing capacity obtained from the applicable bearing capacity interaction curve.

If the bearing capacity is greater than the maximum corner base pressure, execution proceeds to step 840, where the footing dimensions are used in further operations, for instance, in stability checks and strength design checks that are performed for the footing. At step 845, a check is performed to determine if the thickness of the footing has changed due to these further operations. If the thickness has not changed, execution proceeds to step 850, where the foundation design application 540 returns final footing dimensions. If the thickness has changed, execution proceeds to step 855, where the foundation design application 540 adjusts the dimensions (L×B×H) to account for the new footing thickness, and then execution proceeds back to step 810. The steps 815-840 are repeated, with the new footing depth leading to a new embedment depth ($D_f$), and a new soil bearing capacity obtained from the applicable bearing capacity interaction curve. The sequence may be repeated again, and again, until the thickness is not changed, and it is ok to proceed to step 850.

In summary, the present disclosure describes a computer-aided foundation design technique that employs variable soil parameters, such as a variable soil bearing capacity, that are dynamically updated, for example, based on changes in footing shape, size, and/or embedment depth. It should be understood that various adaptations and modifications may be readily made to the embodiments, to suit various implementation constraints. While much of the discussion above deals with soil bearing capacity, it should be understood that other soil parameters may be treated as variable and be dynamically updated. Further, in addition to shape, size, and/or embedment depth, other properties of a foundation design my be used as a basis for updating soil parameters. Further, it should be understood that at least some of the above-described techniques may be implemented in software, in hardware, or a combination thereof. A software implementation may include computer-executable instructions stored in a non-transitory computer-readable medium, such as a volatile or persistent memory, a hard-disk, a compact disk (CD), or other storage medium. A hardware implementation may include specially configured processors, logic circuits, application specific integrated circuits, and/or other types of hardware components. Further, a combined software/hardware implementation may include both computer-executable instructions stored in a non-transitory computer-readable medium, as well as one or more hardware components, for example, processors. Accordingly, it should be understood that the above descriptions are meant to be taken only by way of example.

What is claimed is:

1. A method for computer-aided foundation design and construction, comprising:
   iterating, by a foundation design application that is executed by a processor of an electronic device, through a plurality of footing dimensions for a footing, and for each iteration with different footing dimensions testing base pressure for the footing dimensions against a dynamically updated soil bearing capacity by:
   accessing a bearing capacity interaction curve stored in a memory of the electronic device,
   calculating a value of a soil bearing capacity for the respective footing dimensions using the bearing capacity interaction curve, the value of the soil bearing capacity specific to the footing dimensions,
   calculating a base pressure for the footing, and
   comparing the value of the soil bearing capacity and the base pressure;
   using, by the foundation design application, a selected one of the plurality the footing dimensions whose value of the soil bearing capacity is greater than the base pressure to produce final footing dimensions for the footing; and
   returning the final footing dimensions to a user of the foundation design application for use in construction of the footing.

2. A method for computer-aided foundation design and construction, comprising:
   assuming, by a foundation design application that is executed by a processor of an electronic device, footing dimensions for a footing;
   accessing, by the foundation design application, a bearing capacity interaction curve stored in a memory of the electronic device;
   calculating, by the foundation design application, a value of a soil bearing capacity for the footing dimensions using the bearing capacity interaction curve, the value of the soil bearing capacity specific to the footing dimensions;
   calculating a base pressure for the footing;
   comparing, by the foundation design application, the value of the soil bearing capacity and the base pressure;
   when the value of the soil bearing capacity is greater than the base pressure, using, by the foundation design application, the footing dimensions to produce final footing dimensions for the footing;
   when the value of the soil bearing capacity is not greater than the base pressure, adjusting the footing dimensions, calculating a new value of the soil bearing capacity for the adjusted footing dimensions using the bearing capacity interaction curve, and repeating the calculating a base pressure, and the comparing, for the new value of the soil bearing capacity; and
   returning the final footing dimensions to a user of the foundation design application for use in construction of the footing.

3. The method of claim 2, wherein the bearing capacity interaction curve indicates a soil bearing capacity for footing dimensions for a particular embedment depth.

4. The method of claim 3, wherein the bearing capacity interaction curve is one of a series of bearing capacity interaction curves that indicate soil bearing capacity for footing dimensions and embedment depths.

5. The method of claim 2, wherein the bearing capacity interaction curve is a mathematical formula derived from discreet bearing capacity values by application of a curve fitting algorithm.

6. The method of claim 2, wherein the calculating a base pressure further comprises:
   calculating a plurality of corner base pressures for the footing;
   determining a maximum of the corner base pressures; and
   using the maximum of the corner base pressures as the base pressure in the comparing.

7. The method of claim 2, wherein the dimensions include a footing width and a footing length.

8. The method of claim 2, wherein the dimensions include a footing width, a footing length, and a footing depth.

9. The method of claim 2, further comprising:
   calculating an embedment depth for the footing,
   wherein the accessing access a bearing capacity interaction curve for the calculated embedment depth.

10. The method of claim 2, wherein using further comprises:
    performing a stability check and strength design check with the footing dimensions.

11. A method for computer-aided foundation design and construction, comprising:
    assuming, by a foundation design application that is executed by a processor of an electronic device, footing dimensions for a footing;
    calculating an embedment depth for the footing;
    calculating, by the foundation design application, a value of a soil bearing capacity of the footing using a bearing capacity interaction curve for the footing dimensions and the embedment depth, the value of the soil bearing capacity specific to the footing dimensions and the embedment depth;

calculating a base pressure for the footing;
comparing, by the foundation design application, the value of the soil bearing capacity and the base pressure;
when the value of the soil bearing capacity is greater than the base pressure, using, by the foundation design application, the footing dimensions to produce final footing dimensions for the footing;
when the value of the soil bearing capacity is less than the base pressure, adjusting a thickness of the footing; and repeating the calculating an embedment depth, calculating a new value of the soil bearing capacity for the adjusted footing dimensions, and repeating the calculating a base pressure, and repeating the comparing.

12. A method for computer-aided foundation design and construction comprising:
assuming, by a foundation design application that is executed by a processor of an electronic device, footing dimensions for a footing;
accessing an interaction curve stored in a memory of the electronic device;
calculating a soil parameter for the footing dimensions using the interaction curve to yield a value of a variable soil parameter;
performing, by the foundation design application, a check of the footing using the value of the variable soil parameter;
when the footing passes the check, using, by the foundation design application, the footing dimensions to produce final footing dimensions for the footing, and returning the final footing dimensions for use in construction of the footing; and
when the footing does not pass the check, adjusting the footing dimensions, calculating, by the foundation design application, a new value of the variable soil parameter for the adjusted footing dimensions using the interaction curve and repeating the performing to check the footing using the new value of the variable soil parameter.

13. The method of claim 12, wherein the variable soil parameter includes a soil bearing capacity and the interaction curve includes a bearing capacity interaction curve.

14. The method of claim 12, wherein the interaction curve indicates a soil parameter for footing dimensions for a particular embedment depth.

15. The method of claim 14, wherein the bearing capacity interaction curve is one of a series of bearing capacity interaction curves that indicate soil parameters for footing dimensions and embedment depths.

16. The method of claim 12, wherein the bearing capacity interaction curve is a mathematical formula derived from discreet values by application of a curve fitting algorithm.

17. A non-transitory computer readable medium having software encoded thereon, the software when executed by a processor of an electronic device, operable to:
access a bearing capacity interaction curve;
calculate a value of a soil bearing capacity for footing dimensions of a footing using the bearing capacity interaction curve, the value of the soil bearing capacity specific to the footing dimensions;
calculate a base pressure for the footing;
compare the value of the soil bearing capacity and the base pressure;
when the value of the soil bearing capacity is greater than the base pressure, use the footing dimensions to produce final footing dimensions for the footing;
when the value of the soil bearing capacity is not greater than the base pressure, adjust the footing dimensions, calculate a new value of the soil bearing capacity for the adjusted footing dimensions using the bearing capacity interaction curve, and repeat the operations to calculate a base pressure, and compare, for the new value of the soil bearing capacity; and
return the final footing dimensions to a user for use in construction in the footing.

18. The non-transitory computer readable medium of claim 17, wherein the bearing capacity interaction curve indicates a soil bearing capacity for footing dimensions for a particular embedment depth.

19. The method of claim 1, wherein the bearing capacity interaction curve indicates a soil bearing capacity for footing dimensions for a particular embedment depth.

20. The method of claim 1, wherein the bearing capacity interaction curve is a series of bearing capacity interaction curves that indicate soil bearing capacity for footing dimensions and embedment depths.

21. The method of claim 1, wherein the bearing capacity interaction curve is a mathematical formula derived from discreet bearing capacity values by application of a curve fitting algorithm.

22. The method of claim 1, wherein the dimensions include a footing width, a footing length, and a footing depth.

23. The method of claim 1, further comprising:
calculating an embedment depth for the footing,
wherein the accessing access a bearing capacity interaction curve for the calculated embedment depth.

\* \* \* \* \*